US006548843B2

(12) United States Patent
Wickramasinghe et al.

(10) Patent No.: US 6,548,843 B2
(45) Date of Patent: *Apr. 15, 2003

(54) FERROELECTRIC STORAGE READ-WRITE MEMORY

(75) Inventors: Hemantha K. Wickramasinghe, Chappaqua, NY (US); Ravi F. Saraf, Briar Cliff Manor, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/190,131

(22) Filed: Nov. 12, 1998

(65) Prior Publication Data

US 2002/0089005 A1 Jul. 11, 2002

(51) Int. Cl.[7] .................................................. H01L 29/76
(52) U.S. Cl. ..................... 257/295; 257/298; 365/145
(58) Field of Search ................................ 257/295, 298, 257/310; 365/145

(56) References Cited

U.S. PATENT DOCUMENTS

| 4,972,370 A | * | 11/1990 | Morimoto et al. | 365/106 |
|---|---|---|---|---|
| 5,119,329 A | * | 6/1992 | Evans, Jr. et al. | 365/145 |
| 5,329,485 A | | 7/1994 | Isono et al. | 365/145 |
| 5,341,325 A | * | 8/1994 | Nakano et al. | 365/145 |
| 5,342,452 A | | 8/1994 | Saito et al. | 136/256 |
| 5,343,353 A | * | 8/1994 | Miki et al. | 361/322 |
| 5,349,238 A | | 9/1994 | Ohsawa et al. | 257/736 |
| 5,432,379 A | | 7/1995 | Eguchi et al. | 257/627 |
| 5,457,343 A | | 10/1995 | Ajayan et al. | 257/734 |
| 5,541,422 A | * | 7/1996 | Wolf et al. | 257/9 |
| 5,631,664 A | | 5/1997 | Adachi et al. | 345/74.1 |
| 5,658,802 A | | 8/1997 | Hayes et al. | 436/518 |
| 5,670,827 A | | 9/1997 | Sakuma et al. | 257/741 |
| 5,717,235 A | * | 2/1998 | Gendlin | 257/295 |
| 5,736,759 A | * | 4/1998 | Haushalter | 257/295 |
| 5,737,180 A | * | 4/1998 | Yoo | 361/313 |
| 5,822,240 A | * | 10/1998 | Yoo | 365/145 |
| 6,150,184 A | * | 11/2000 | Evans et al. | 438/3 |

OTHER PUBLICATIONS

Braun, Erez et al., "DNA–templated assembly and electrode attachment of a conducting silver wire", *Nature*, vol. 391, Feb. 19, 1998, pp. 775–777.

(List continued on next page.)

*Primary Examiner*—George Eckert
(74) *Attorney, Agent, or Firm*—Connolly Bove Lodge & Hutz, LLP; Robert M. Trepp, Esq.

(57) ABSTRACT

A memory device including at least one pair of spaced apart conductors and a ferroelectric material between the pair of conductors. The pair of conductors is spaced apart a distance sufficient to permit a tunneling current therebetween.

91 Claims, 4 Drawing Sheets

OTHER PUBLICATIONS

Kajiyama, T. et al., "Electric field induced structural change for poly(vinylidene fluoride co trifluoroethylene) ultrathin films studied by scanning Maxwell stress microscope", J. Vac. Sci. Technol. B, Microelectron Nanometer Struct. (USA), vol. 16, No. 1, Jan. Feb. 1998, P. 121–4, Conference, Fourth International Workshop on the Measurement, Characterization, and Modeling of Ultra Shallow Doping Profiles in Semiconductors. Abstract.

*The Quantum Dot: A Journey Into the Future of Microelectronics,* Richard Turton, 1995.

*Quantum Functional Devices: Present Status and Future Prospects,* A.C. Seabaugh, et al. (p. 9–21), 1993.

Reviews of Modern Physics, vol. 64, No. 3, Jul. 1992, The single–electron transistor (p. 849–858).

Journal of Bacteriology, vol. 176, No. 7, Apr. 1994, Minireview, D–Loops and R–Loops: Alternative Mechanisms for the Initiation of Chromosome Replication in *Escherichia coli* (p. 1807–1812).

Nucleic Acids Research, 1995, vol. 23, No. 17, Double stranded scission of DNA directed through sequence–specific R–loop formation, Ralf Landgraf, et al.

Nucleic Acids Research, 1995, vol. 23, No. 17, R–loop stability as a function of RNA structure and size, Ralf Landgraf, et al. (p. 3516–3523).

Biochimie (1996) 78, Mechanisms of primer RNA synthesis and D–loop/R–loop–dependent DNA replication in *Escherichia coli* (p. 1109–1117).

\* cited by examiner

FERROELECTRIC STORAGE READ-WRITE MEMORY

FIELD OF THE INVENTION

The invention relates to memory devices and methods for forming memory devices.

BACKGROUND OF THE INVENTION

The shrinking dimensions of active devices on silicon chip is approaching its limit due to restrictions set by photolithographic techniques. For example, wave properties of radiation, such as interference and diffraction, can limit device size and density. Considerable research has taken place to overcome the limitations of photolithographic techniques.

The research has been directed at correcting the problems, such as by phase shift lithography as well as to developing other novel approaches. Concomitantly, with this research, there have been developments in device design utilizing electron confinement in small volume. The three basic categories of such device design are Quantum Dots (QD), Resonant Tunneling Devices (RTD), and Single Electron Transistors (SET). Quantum Dots are discussed in greater detail in R. Turton, The Quantum Dot, Oxford, U.K., Oxford University Press, 1995; Resonant Tunneling Devices are discussed in greater detail in A. C. Seabaugh et al., Future Electron Devices (FED) J., Vol. 3, Suppl. 1, pp. 9–20, (1993); and Single Electron Transistors are discussed in greater detail in M. A. Kastner, Rev. Mod. Phys., Vol. 64, pp. 849–858, (1992); the entire disclosures of all of which is hereby incorporated by reference.

SUMMARY OF THE INVENTION

The present invention provides a memory device including at least one pair of spaced apart conductors. A ferroelectric material is arranged between the conductors. The conductors are spaced apart a distance sufficient to permit a tunneling current there between.

Other aspects of the present invention provide a method for forming a memory device. The method includes providing at least one pair of spaced apart conductors on a substrate. A ferroelectric material is provided between the pair of conductors. The pair of conductors is spaced apart a distance sufficient to permit a tunneling current there between.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

The present invention provides a ferroelectric storage read-write memory. Generally, a storage device according to the present invention includes a thin ferroelectric layer between two electrodes. Typically, the thickness of the ferroelectric layer is sufficient to permit tunneling.

Data may be stored in a storage device according to the present invention by aligning an electric dipole of the ferroelectric layer. The different alignment states of the dipole may be considered to be either "up close" or "down". By controlling the electric dipole of the ferroelectric layer, the tunneling current may be regulated.

Data may be written in a ferroelectric storage device according to the present invention by applying a voltage sufficiently high to produce an electric field above a threshold cohesive field, $E_c$. A voltage at least as great as the $E_c$ will flip the internal dipole of the ferroelectric material. Different values may be assigned to the different states of the dipole. One state may be assigned a value of "0", while the other state may be assigned a value of "1". Accordingly, the storage device permits storage of information.

Reading a storage device according to the present invention is performed at a voltage well below a voltage required to generate an electric field at or above the $E_c$ value, such that the electric field produced in the ferroelectric material is less than $E_c$. Thus, at this lower voltage, the dipoles of the ferroelectric material do not flip during reading.

The general methods for storage use according to memory device of the present invention utilize the property of the high dielectric constant of ferroelectric materials to store charge and "reading" the stored charge by field transistor type structures. For more detail regarding this aspect of the invention, references made to U.S. Pat. No. 5,487,029, the entire contents of the disclosure which is hereby incorporated by reference.

The present invention also includes methods of forming a memory device. Broadly, the methods may be described as providing at least one pair of spaced apart conductors and providing a ferroelectric material between the pair of conductors. The pair of conductors are spaced apart a distance sufficient to permit a tunneling current there between.

Figure 1:
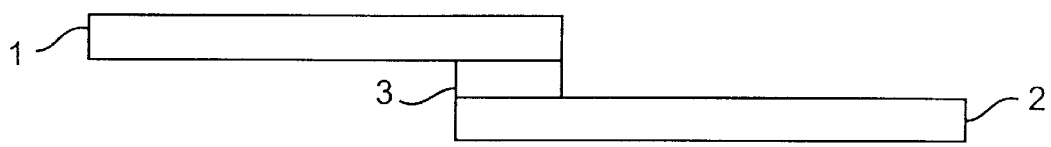
FIG. 1 represents a cross-sectional view of an embodiment of a ferroelectric storage device according to the present invention.

FIG. 1 illustrates an example of a ferroelectric storage read-write memory device according to the present invention. The embodiment illustrated in FIG. 1 generically illustrates a scheme according to the present invention for high density storage. Along these lines, the embodiment illustrated in FIG. 1 shows the essential features of a single "storage cell" according to the present invention. As such, the device illustrated in FIG. 1 is a single storage cell that can store one bit of data, that is, either a zero or one.

A storage device according to the present invention may be described as two spaced apart electrodes 1 and 2, in the embodiment illustrated in FIG. 1, interconnected with a region of ferroelectric material 3. The exact structure of a storage device according to the present invention may vary greatly. However, the electrodes in the ferroelectric material typically will be identifiable as part of the structure.

A structure according to the present invention may be imbedded in a dielectric layer. Typically, the dielectric material surrounding the storage device according to the present invention can have a dielectric constant of about one to about ten. Examples of such dielectric materials include air, having a dielectric constant of one; silicon nitride, having a dielectric constant of seven; alumina, having a dielectric constant of about 9.2 to about 9.4; and silicon dioxide, having a dielectric constant of 3.9, are examples of dielectric constants. In view of the fact that the dielectric may be air, it is apparent that a storage device according to the present invention may simply be formed on a substrate with no material overlying or adjacent the sides of the device.

The electrodes 1 and 2 in the embodiment illustrated in FIG. 1, which are typically referred to as conductors herein, may be made of a variety of different materials. Along these lines, conductors or electrodes 1 and 2, typically are made of an electrically conducting material. For example, the electrodes may be metallic or doped semiconductors. Examples of metals that may be utilized in the electrodes includes one or more of aluminum, gold, silver, copper and/or alloys including any one or more of these metals. Examples of semiconductors include silicon and silicon-germanium.

While the physical dimensions of memory cells according to the present invention may vary, typically, the electrodes 1 and 2 have line widths ranging from about 1 nm to about 500 nm and thicknesses ranging from about 100 nm to about 1000 nm. Additionally, the ferroelectric material can be a film having a thickness of less than about 10 nm.

The composition of the ferroelectric material 3 utilized according to the present invention may vary. One factor that may effect the composition of the ferroelectric material is the desired read and write voltages for a device. One way to control the read and write voltage is through controlling the Curie temperature of the ferroelectric material. Along these lines, the ferroelectric materials with higher Curie temperatures can increase both the read and write voltages, $V_r$ and $V_w$, respectively. Examples of ferroelectric materials that may be utilized according to the present invention include barium titanate, having a Curie temperature $T_c$ of 120° C.; lead titanate, having a Curie temperature 490° C.; potassium niobiate, having a Curie temperature of 415° C.; tri-glycine sulphate, having a Curie temperature of 49° C.; Rochelle salt (potassium-sodium tartrate), having a Curie temperature of 23° C.; and lead iron niobiate, having a Curie temperature of 112° C.

As stated above, writing a storage device according to the present invention typically includes applying a write voltage, $V_w$, having a value sufficient to generate an electric field, $E_c$, to control the internal dipole of the ferroelectric material. The electric field produced in the ferroelectric material should be at least as great as the course of field $E_c$ of the ferroelectric material. The value of $V_w$ may depend upon the composition of the ferroelectric material. The value of $V_w$ may also depend upon the temperature difference between the ferroelectric material Curie temperature and the operation temperature.

For example, typically, the smaller the temperature difference, the lower the threshold voltage for writing or switching the dipole. For example, if the ferroelectric material includes barium titanate, the typical electric field to flip the dipole of this material at room temperature is below 10,000 V/Cm. This electric field may vary from about 1000 V/cm to about 10,000 V/cm for the thicknesses described herein. According to one example, for thickness of ferroelectric material about 100 nm, the voltage required to flip the dipole is above about 100 mV.

Figure 2A:
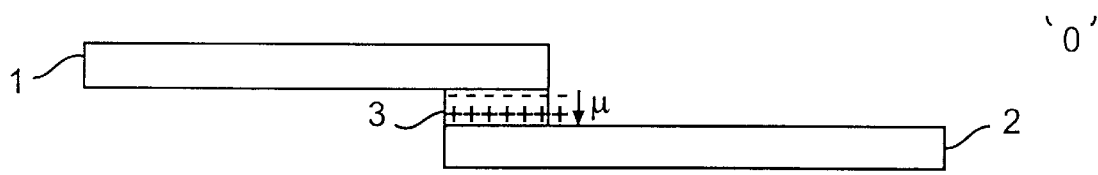
FIG. 2a, FIG. 2b, and FIG. 2c represent cross-sectional views of an embodiment of a ferroelectric storage device according to the present invention illustrating the operation of the embodiment.
Figure 2B:
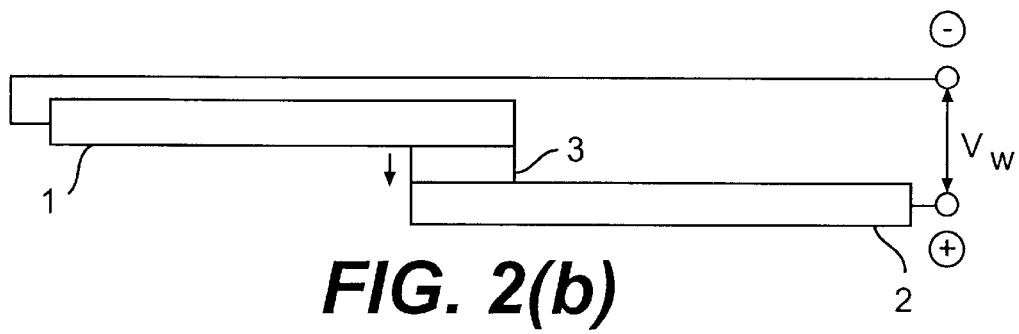

In writing a storage device according to the present invention, each dipole moment of the ferroelectric material may be assigned a value. For example, one state may be assigned a value "0" and the other state assigned a value of "1". FIG. 2a illustrates a state wherein the dipole, $\mu$, of the ferroelectric material 3 is pointing down, in the orientation of FIG. 2a. This state may be assigned a value of "0". To flip the dipole moment to state "1", an upward electric field corresponding to a voltage greater than $V_w$ may be applied between the electrodes 1 and 2, as illustrated in FIG. 2b.

Figure 2C:
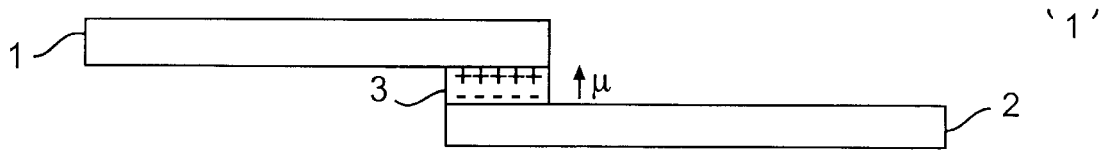

As illustrated in FIG. 2c, as a result of applying the write voltage, the dipole moment of the ferroelectric material has been reversed. This state may be assigned a value of "1".

Reading a storage device according to the present invention may be performed very similarly to writing a storage device according to the present invention. One difference between the read and the write methods is that the voltage applied to read the memory $V_r$ is much smaller than the write voltage $V_w$. To read a memory device according to the present invention, a read voltage is applied between the two electrodes 1 and 2 and a tunneling current is measured. According to one example, the read voltage $V_r$ is positive on electrode 1 and negative on electrode 2. According to this example, the tunneling current, I, will be high for state 1 illustrated in FIG. 2c and low for state zero illustrated in FIG. 2a for a given $V_r$. The tunneling current measured may then be converted to voltage by electronics to correspond to the two states of the memory device.

As can be appreciated from the above description, reading and writing the storage device according to the present invention may be carried out utilizing the same circuitry. This is one advantage of the present invention. Another advantage of the present invention is that the storage may be permanent.

Typically, the read voltage is well below the threshold voltage required to flip the dipole to ensure that the reading voltage does not alter the state of the memory device. For example, for barium titanate as a ferroelectric material, the read voltage may be below about 100 mV to read the memory device without flipping the dipole moment. The read voltage may vary from about 1 mv to about 100 mv.

The dipole moment, or remnant polarization, may be induced by applying the write or bias voltage between the conductors. If the bias voltage is sufficient to produce an electric field in the ferroelectric material higher than the course of the field of the ferroelectric material, the bias voltage can be considered write voltage. The remnant polarization of the ferroelectric material may be reversed, that is, flipped by changing the sign of the bias voltage between the conductors.

If, on the other hand, the bias voltage produces an electric field lower than the course of field of the ferroelectric material, the remnant polarization of the ferroelectric material would not be altered. This bias voltage may be considered to be read bias voltage. The tunneling current created by the read bias voltage may be detected and analyzed to determine the remnant polarization of the ferroelectric material and, thus, the state of the memory device.

In other words, by determining the tunneling current, it may be determined whether the memory device has a "0" state or a "1" state. Along these lines, when tunneling current is high, it may have a value in the upper half of a range of about 0.1 mA to about 10 mA. The tunneling current is high when the read bias voltage, that is, less than half the write bias voltage is anti-parallel to the remnant polarization. Typically, the read bias voltage will be less than about one-half of the write voltage.

On the other hand, the tunneling current is "low" when the "read" bias voltage, that is, less than half the write bias voltage, is parallel to the remnant polarization of the ferroelectric material. In such cases, the tunneling current may have a value in the lower half of about 0.1 mA to about 10 mA.

Simultaneously with applying the read bias voltage, heat may be locally applied to the ferroelectric material. The increased temperature of the ferroelectric material may decrease the coercive field, going all the way to zero or about zero at the Curie temperature. According to one example, heat is locally applied to the ferroelectric material utilizing light resistive heating. According to one example, the light resistive heating is applied utilizing a laser. The temperature may be any temperature above room temperature up to about the Curie temperature of the particular material.

The present invention includes a plurality of structures incorporating the above-described general configuration of the invention, including at least two spaced apart conductors. The conductors may be arranged in the same plane. Alternatively, the conductors may be arranged in different planes. If they are not arranged in the same plane, the pair of conductors may be separated in a vertical direction by a distance of up to about 10 nm.

A ferroelectric material is arranged between the conductors. The ferroelectric material may have a thickness of up to about 10 nm. The ferroelectric material may include at least one ferroelectric crystal made of any of the above discussed materials. The ferroelectric material may have a Curie temperature of about 23° C. to about 490° C. Additionally or alternatively, the ferroelectric material may have a nature such that the voltage required to switch a dipole of the ferroelectric material is from about 100 mV to about 10,000 mV. The bias voltage required to read the memory device may be less than about 10 mV.

A dielectric material may surround the conductors and the ferroelectric material. The dielectric material may have a dielectric constant of about 1 to about 10.

Figure 3A:
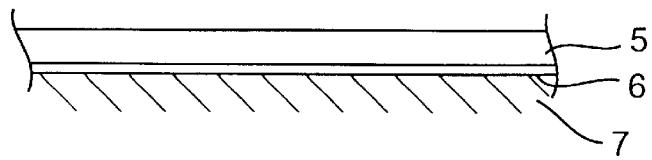
FIG. 3a, FIG. 3b, FIG. 3c, and FIG. 3d illustrate cross-sectional views of various stages of an embodiment of a process for forming a ferroelectric storage device according to the present invention.
Figure 3B:
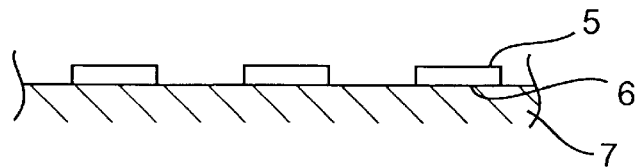
Figure 3C:
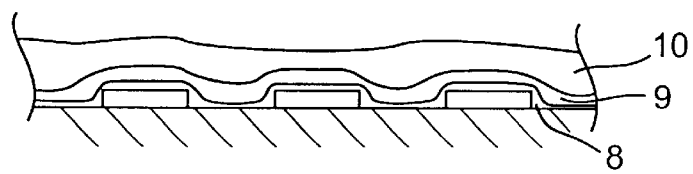
Figure 3D:
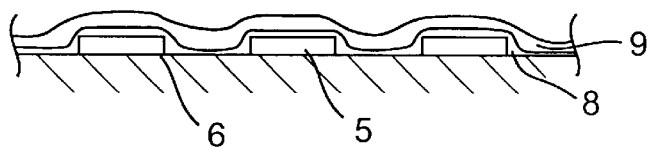
Figure 4:
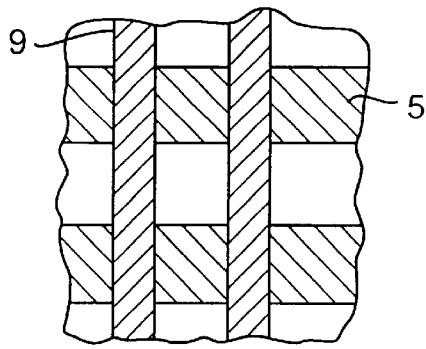
FIG. 4 represents an overhead view of an embodiment of a ferroelectric storage device according to the present invention.

While FIG. 1 illustrates a general simple view of a memory device according to the present invention, FIGS. 3d and 4 illustrate a larger device including a plurality of structures such as that illustrated in FIG. 1. Along these lines, the embodiment of the present invention illustrated in FIGS. 3d and 4 includes a plurality of first parallel conductors 5 and a plurality of second parallel conductors 9. In the embodiment illustrated in FIGS. 3d and 4, second parallel conductors 9 are perpendicular to first parallel conductors 5 and overlay first parallel conductors 5. Ferroelectric material 8 is deposited at least between first parallel conductors 5 and second parallel conductors 9.

As can be appreciated from the above discussion and from FIGS. 3d and 4, the present invention may include a plurality of first conductors 5 and only one second conductor 9. Alternatively, the present invention could include one first conductor 5 with a plurality of second conductors 9 arranged over the first conductor 5. In the embodiment illustrated in FIGS. 3d and 4, each junction where a conductor of the second set of conductors 9 overlies a conductor of the first conductors 5 will be a storage cell. As such, each location where the conductors overlap and the ferroelectric material between then represents a pair of conductors such as FIG. 1 shows. The size of each of storage cell will be at least in part controlled by the width and the spacing of the conductors.

As is evident from the embodiment illustrated in FIG. 3d and FIG. 4, a plurality of spaced apart conductors may be provided on a substrate and ferroelectric material provided between the conductors. In an embodiment such as that illustrated in FIGS. 3d and 4, although the embodiment includes a plurality of conductors 5 and a plurality of conductors 9, either one of these groups of conductors may include only one conductor.

In forming an embodiment such as that illustrated in FIGS. 3d and 4, an adhesion layer may first be provided on a substrate. A first metallic layer may be provided on the adhesion layer 6. A first photoresist layer may be provided on the first metallic layer.

The photoresist layer may be exposed to form a desired pattern. The photoresist may then be developed. Development of the photoresist forms a mask over the first electrically conductive layer. Utilizing this photoresist mask, the first electrically conductive layer 5 may be etched. The photoresist remaining after development may then be removed, or stripped.

Next, a layer of ferroelectric material may be provided at least one portion of the remaining portion of the etched first electrically conductive layer. The ferroelectric material may be deposited on a plurality of portions of the etched first electrically conductive layer. The ferroelectric material may also be provided on the substrate exposed by etching the first electrically conductive layer. Etching of the first electrically conductive layer may also remove portions of the adhesion layer that do not lie under the photoresist and portions of the first electrically conductive layer that lie under the photoresist.

A second electrically conductive layer may then be provided on the layer of ferroelectric material and possibly portions of the substrate between the remaining portions of the first layer of electrically conductive material as well as on the regions between the remaining portions of the first layer of electrically conductive material, whether these regions are over the substrate or over the adhesion promoter. A second layer of photoresist is provided on the second layer of electrically conducting material. The second layer of photoresist is exposed and developed and the second layer of electrically conducting material is etched. The second layer of photoresist may then be stripped.

According to another embodiment of the present invention, at least one of the sets of the conductors includes an organic molecule. One example of an organic molecule is DNA, as in the embodiment illustrated in FIGS. 5–7. FIG.

Figure 5:
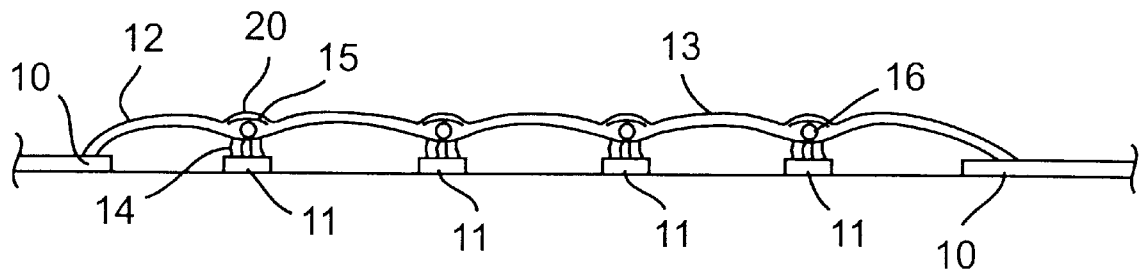
FIG. 5 represents a cross-sectional view of another embodiment of a ferroelectric storage device according to the present invention.

7 illustrates a cross-sectional view of an example of an embodiment according to this aspect of the present invention. FIG. 5 illustrates a broader view of the embodiment illustrated in FIG. 7 prior to conducting additional processing to form the final embodiment illustrated in FIG. 7. As illustrated in FIG. 5, the memory cell illustrated in FIG. 7 may include a plurality of conductors 10 and 11. In the embodiment illustrated in FIGS. 5–7, the DNA strand, or other organic molecule, acts as one conductor. The conductors 11 act as the other conductor in the pair of spaced apart conductors generally represented in FIG. 1. The figures indicate the presence of at least one R-loop 20, formed in part by a molecule of RNA 15 located over each conductor 11. In an embodiment of the present invention, at least one nanoparticle 16, comprising a ferroelectric material, is bound to the DNA of at least one R-loop 20. In a preferred embodiment, at least one nanoparticle is bound to the DNA of each R-loop.

Figure 1A:
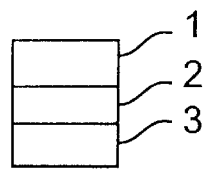

In the embodiment of the present invention illustrated in FIG. 1, it is the portion of the conductors and the ferroelectric material illustrated in FIG. 1a that forms the tunneling junction/gap of the memory device according to the present invention. In the embodiment of the present invention illustrated in FIG. 7, the tunneling gap 19 between the electrode 11 and the electrically conducting material 18 is provided by the nanoparticle and the molecules between the nanoparticle and the conductor, or electrode, 11. According to such an embodiment, the storage cell includes a switch where the tunneling current between the DNA and gate electrode 11 is modulated by the polarization state of the ferroelectric nanoparticle. The bit stored by this embodiment is static. Reading and writing the cell is performed by the same circuitry. The cell size may be limited by dimensions of the gate electrode.

Figure 6:
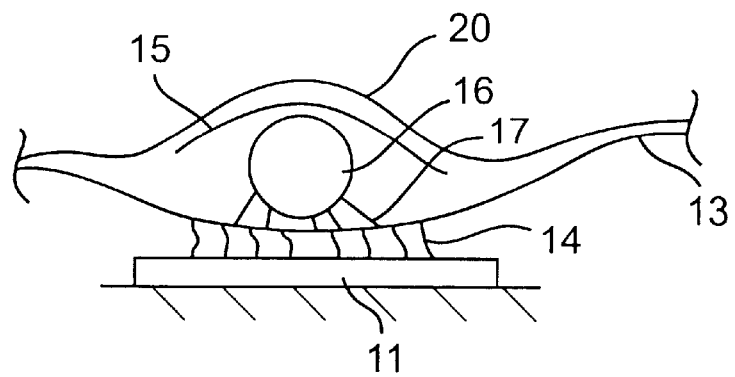
FIG. 6 represents a cross-sectional view of a portion of the embodiment of the present invention illustrated in FIG. 5 at a larger scale.
Figure 7:
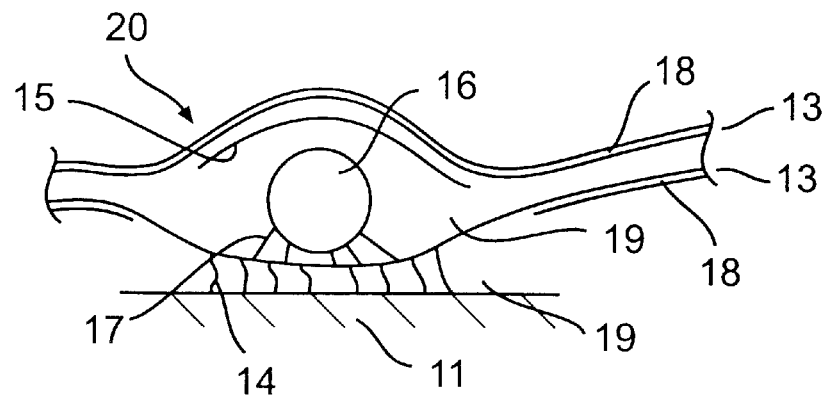
FIG. 7 represents a cross-sectional view of the embodiment of the present invention illustrated in FIG. 6 after further processing.

When comparing the embodiment shown in FIGS. 5–7 with the embodiment illustrated in FIG. 4, at least one of the conductors 5 and/or at least one of the conductors 9 may be replaced with at least one organic molecule. In other words, at least one of the electrodes in the pair of electrodes illustrated in FIG. 1 may be replaced with at least one organic molecule. Ferroelectric material will still be deposited between the organic molecule and the other of the electrodes. The ferroelectric material would be arranged between the organic molecule and the other of the electrodes.

The ferroelectric material may be arranged on the at least one organic molecule. Along these lines, the ferroelectric material may be attached, such as by bonding or otherwise to the at least one organic molecule. An electrically conducting material may also be attached to the at least one organic molecule to provide the conductive nature to the organic molecule to provide the function as the conductor 9 in the embodiment illustrated in FIG. 4, for example.

The at least one organic molecule may include at least one oligomer attached to at least one location on the at least one organic molecule. The at least one oligomer may be included in a monolayer of oligomers attached to at least one portion of the at least one organic molecule.

If the at least one organic molecule is a DNA molecule, the DNA molecule may be single or double stranded. The embodiment illustrated in FIGS. 5 through 7 includes a double stranded DNA molecule. According to one example, the DNA is λ-DNA. However, any DNA molecule having any sequence of bases may be utilized according to the present invention. In other words, the DNA may be subjectively selected.

The at least one DNA molecule may include at least one R-loop. Typically, the at least one R-loop is formed over at least one of the conductors, such as conductors 11, that the at least one DNA molecule is arranged over.

As stated above, the DNA molecule that may be included in a structure according to the present invention may include an R-loop. Description of R-loops may be found in Asai and Kogoma, *D-Loops and R-Loops: Alternative Mechanisms for the Initiation of Chromosome Replication in Escherichia coli*, JOURNAL OF BACTERIOLOGY, April 1994, pp. 1807–1812; Landgraf et al., *R-loop stability as a function of RNA structure and size*, NUCLEIC ACIDS RESEARCH, 1995, Vol 23, No. 7, pp. 3516–3523; Landgraf et al., *Double stranded scission of DNA directed through sequence-specific R-loop formation*, NUCLEIC ACIDS RESEARCH, 1995, Vol 23, No. 7, pp. 3524–3530; and Masai and Arai, *Mechanisms of primer RNA synthesis and D-loop/R-loop dependent DNA replication in Escherichia coli*, BIOCHEMIE (1996) 78, pp. 1109–1117, the entire contents of all of which are hereby incorporated by reference.

As described below in greater detail, the R-loop may function to provide a site for the attachment of the nanoparticle(s) to the DNA molecule. Each R-loop may include at least one nanoparticle bonded to a portion of the DNA within the R-loop. In addition to including more than one R-loop, more than one nanoparticle could be attached to a portion of the DNA molecule within each R-loop. Steps for attaching the nanoparticle(s) to the R-loop are discussed below in greater detail.

The R-loops may be formed according to any known technique for forming R-loops, such as those disclosed in the above-references scientific literature articles. At least one RNA molecule having a sequence complementary to at least one portion of the DNA molecule may be utilized in formation of the R-loop. As stated above, the DNA molecule may include more than one R-loop. Therefore, the more than one RNA molecule may be utilized to form R-loops in the DNA molecule. Each RNA molecule may have a sequence complementary to a different sequence of the DNA molecule.

The sequence of the RNA molecule may be controlled to control where the R-loop(s) is(are) created. For example, if the DNA molecule is to include one R-loop and the R-loop is to be centrally located in the DNA molecule, the RNA molecule may have a sequence complementary to a sequence of the DNA molecule such that the RNA molecule will be substantially centered on the DNA molecule, equidistant from the ends of the DNA molecule upon formation of the R-loop. The DNA molecule may have any sequence that permits formation of a desired number of R-loops in desired location(s).

The sequence of the RNA molecule that may be utilized in forming the R-loop(s) may vary, depending upon the positioning of the DNA molecule relative to an electrode that may lie under the DNA molecule. Along these lines, the RNA molecule may have a sequence such that the R-loop may be positioned over an underlying electrode. If the present invention includes more than one R-loop and the R-loops each overly an electrode, the RNA molecules utilized in forming the R-loops may have sequences such that the R-loops will be positioned over the underlying electrodes, such as the electrodes 11 in the embodiment illustrated in FIGS. 5–7.

The length of the R-loop may vary, depending upon the embodiment. According to one example, the length of the R-loop, in other words the number of nucleotide bases on the DNA molecule that the at least one R-loop occupies, may depend upon the width of the conductors or electrodes 11 arranged under the DNA molecule where the R-loop is formed. According to one example, the RNA 15 forming the R-loop may be about 10 to about 1,500 bases long. This corresponds to a length of about 3 to about 500 nm. Typically, the R-loop forming RNA has a length of about 30 to about 300 bases, corresponding to a length of about 10 to about 100 nm.

The ferroelectric material may be attached to the DNA molecule within the R-loop. According to such embodiments, the ferroelectric material typically is attached to the portion of the DNA molecule in the R-loop that is not bonded to the R-loop forming RNA 15.

At least one chemical moiety may be attached to at least one nucleotide in the at least one R-loop. The at least one chemical moiety may include the ferroelectric material. The at least one chemical moiety may be attached to the DNA molecule within the R-loop by at least one hydrogen bond and/or at least one covalent bond.

The nature of the at least one chemical moiety attached to the organic molecule may vary from embodiment to embodiment. According to one embodiment, the at least one chemical moiety includes at least one nucleotide. According to some embodiments, the at least one chemical moiety may include a plurality of chemical moieties. At least one of the moieties typically is capable of bonding to at least one nucleotide in the at least one R-loop. According to some embodiments, the at least one chemical moiety includes at least one acid group and at least one alcohol group.

The at least one chemical moiety may additionally or alternatively be attached to at least one amide group on the at least one DNA molecule within the R group. The at least one chemical moiety may include two nucleotides bonded to two nucleotides on the DNA molecule within the R-loop. The two molecules included in the chemical moiety and include guanine and cytosine or thymine and adenine.

As stated the chemical moiety may include a nanoparticle. The nanoparticle may include the ferroelectric material. The nanoparticle may have a maximum width of less than about 10 nm.

The at least one chemical moiety may include at least one nanoparticle. To facilitate bonding of the nanoparticle to the organic structure, the nanoparticle may include one or more atoms or chemical groups attached to the nanoparticle. By attaching one or more such atoms or groups, the nanoparticle may be "functionalized".

In the case where the organic structure includes a DNA molecule, at least one nucleotide may be attached to the nanoparticle. The at least one nucleotide attached to the nanoparticle typically is complementary to at least one nucleotide within the R-loop of the DNA molecule on the portion of the R-loop not attached to the RNA molecule. Therefore, the nucleotide attached to the nanoparticle may depend upon the sequence of the DNA molecule and where it is desired that the nanoparticle attach to the DNA molecule. The nanoparticle and the attachment of the nanoparticle to the DNA molecule are discussed above in greater detail.

The nanoparticle may attach to the portion of the DNA molecule anywhere within the R-loop. According to one embodiment, the nanoparticle attaches to the DNA about in the center of the portion that lies within the R-loop. Therefore, the location of the ferroelectric may depend upon the location of the R-loop. For example, the nanoparticle may be attached to the DNA molecule midway between the ends of the DNA molecule if the DNA molecule includes one R-loop substantially in the center of the DNA molecule.

Regardless of whether the present invention includes an organic molecule as in the embodiments illustrated in FIGS. 5 through 7 or typical lithographically defined conductors as in the embodiment illustrated in FIGS. 3d and 4, the present invention typically is formed on a substrate. Examples of substrates that the present invention may be formed upon include glasses and/or ceramics. Examples of such materials include quartz, alumina, and PYREX.

Also, regardless of whether the present invention includes a DNA molecule as in the embodiments illustrated in FIGS. 5 through 7 or typical lithographically defined conductors as in the embodiment illustrated in FIGS. 3d and 4, the present invention may include an adhesion layer arranged between the conductors and the substrate. FIG. 3d illustrates an example of adhesion layer. The adhesion layer between the conductors and the substrate may include at least one electrically conducting material. For example, the adhesion layer may include chromium and/or titanium. The adhesion layer may also be arranged between second conductors 9 and the substrate where second conductors 9 are adjacent the substrate rather than arranged over the first conductors 5. In the embodiment illustrated in FIGS. 5–7, prior to arranging the DNA molecule over the conductors 11, an adhesion promoter 14 may be provided on the surface of the conductors 11.

The conductors of the memory device according to the present invention, whether they are conductors such as conductors 5 and 9 illustrated in FIGS. 3d and 4 or conductors 10 and 11 and organic molecule based conductors such as those illustrated in FIGS. 5 through 7, may be separated from each other by a distance of about 50 nm to about 5,000 nm. Additionally, each of the types of the conductors may have a width of about 50 nm to about 5,000 nm.

Additionally, the conductors of each type may be parallel to each other. For example, all of the conductors 5 may be parallel to each other or all of the conductors 9 may be parallel to each other. The conductors of one type may also be arranged equidistantly from each other. Alternatively, all of the conductors of one type may not be the same distance from other conductors of the same type.

The organic molecule, or, more alternatively, organic structure, may be connected to electrodes on the surface of a substrate, such as electrode 10 in the embodiment illustrated in FIG. 5. The electrodes are described above in greater detail. The connection may be effected in a variety of ways. For example, the connection may be carried out by providing sites on the electrodes that the organic structure may be attached to.

The attachment sites may be provided by a variety of structure. For example, one or more atoms or molecules may be provided on one or more of the electrodes. According to one example, at least one organic molecule is provided on at least one of the electrodes. The organic molecule could be bonded to the surface of the electrode(s).

According to one example, in which the organic structure includes a DNA molecule extending between the electrodes 10, at least one DNA and/or RNA molecule may be attached to the electrodes 10 shown in FIG. 5. In the case where the organic structure includes DNA, typically, DNA is provided on the electrodes 10. The DNA may be provided on the electrodes in a variety of ways.

According to one example, the DNA is bonded to an atom or molecule that facilitates its connection to the electrodes. For example, the DNA could be sulfur terminated. The sulfur terminated ends could attach to the surface of the gold electrodes. It is well known that S⁻ terminated compounds bond to a gold surface.

The DNA molecule extending between the electrodes 10 may bond to the DNA and/or RNA on the electrodes. For example, both the DNA molecule that is to extend between two electrodes and the DNA molecule(s), as in the above example, attached to the electrodes could have a single stranded portion. The single stranded portions on the DNA molecule that is to extend between the electrodes and the DNA molecule(s) attached to the electrodes may have complementary ends to facilitate their bonding to each other.

According to one embodiment, the DNA that is attached to the electrodes is single stranded, sulfur terminated DNA. Regardless of whether single or double stranded DNA or RNA is bonded to the electrodes, the DNA and/or RNA may include from about 30 to about 30,000 bases. However, the DNA may be as long as about 10,000 base pairs and the RNA molecules could include about 40 bases.

Additionally, regardless of whether single or double stranded DNA or RNA molecules are bonded to the electrodes, the DNA and/or RNA molecules attached to one electrode 10 may have a different sequence of bases than the DNA and/or RNA molecules attached to the other of the electrodes 10. Alternatively, a portion of the DNA and/or RNA molecules that the DNA that is to extend between the electrodes may have a different sequence, rather than the entire DNA and/or RNA molecules.

According to an embodiment in which DNA molecules are attached to the electrodes and the DNA molecules include a sequence of bases to bond to the DNA molecule that is to extend from between the electrodes 10, the DNA molecule that is to extend between the electrodes may include "sticky ends" that have a sequence of bases that is complementary to the DNA attached to the electrodes.

Figure 8:
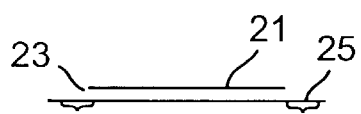
FIG. 8 represents an embodiment of an embodiment of a DNA molecule that may be utilized according to the present invention.
Figure 9:
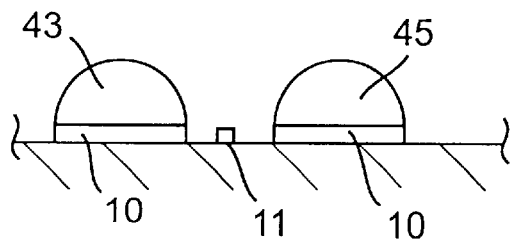
FIGS. 9–11 represent cross-sectional views of an embodiment of a device according to the present invention at various stages of an embodiment of a process according to the present invention.

FIG. 8 illustrates an embodiment of a DNA molecule 21 that is to extend between the electrodes 10. FIG. 8 only illustrates one electrode 11 between electrodes 10 to ease understanding of this aspect of the invention. The DNA molecule 21 is shown in a linear configuration. The sticky ends 23 and 25 are provided on the ends of the DNA molecule.

After constructing or otherwise obtaining the DNA molecules to be attached to the electrodes 10 they may be attached to the electrodes. A solution may be formed, that the DNA molecules are to be added to. First, an aqueous solution of a salt is formed. One Example of a salt is sodium chloride. Each DNA molecule, where a different molecule is to be attached to each electrode 10, may then be added to the solutions.

After formation of the solutions, a quantity 43 of one solution may be placed on the one electrode 10 and a quantity 45 of the other solution may be placed on the other electrode 10. Which solution is placed on which electrode may depend upon how it is desired that the DNA molecule that is to extend between the electrodes is to be oriented. The quantity of the solution deposited on each electrode may depend upon the concentration of the DNA, RNA, and/or other molecule that is in the solutions.

In determining the above factors, the resulting final structure is important. That is, one DNA bridge between electrodes 10 should form. The concentration of volume typically is secondary. A flowing solution could also be utilized.

After application of solutions to the electrodes to deposit the desired molecules on the electrodes, the solutions may be removed. Typically, the solutions are permitted to remain on the electrodes for a time sufficient for a number of molecule to be attached to the electrodes to facilitate the attachment of the organic structure between the two electrodes. Typically, the solutions remain for a time of about 10 minutes to about 20 minutes.

Removal of the solution may be carried out in a number of ways. For example, the solution may be washed off. For example, water could be utilized to wash the solution off. Typically, the solution is washed off with a liquid that does not include any moieties that attach to —S—Au bonds. Alternatively, the solution could be permitted to dry with or without the application of heat. According to one example, an air gun could be utilized.

Figure 10:
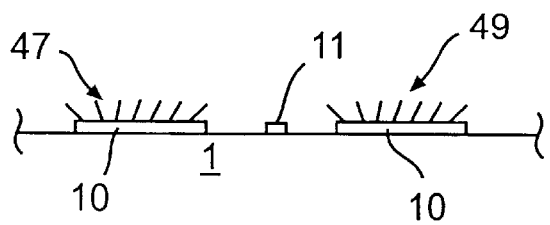

FIG. 10 illustrates the electrodes 10 once the solution has been removed. The molecules 47 and 49 remain attached to the electrodes.

After attachment of the anchoring molecules to the electrodes, the structure that is to extend between the electrodes 10 may be applied to the structure, such as illustrated in FIG. 10. In the case where the organic structure includes DNA, the DNA may be applied to the substrate over the electrodes and space between the electrodes. The organic structure could be applied in a solution. One method for creating a DNA bridge between electrodes is disclosed in Braun et al., *DNA-templated assembly and electrode attachment of a conducting silver wire,* Nature, Vol. 391, pp. 775–777, Feb. 19, 1998, the entire contents of which is hereby incorporated by reference.

After application of the DNA molecule(s), the ones that are to extend between the electrodes, to the substrate and electrodes they may bond to an organic structure, such as anchoring molecules, attached to the electrodes. To promote a desired orientation of the DNA molecules with respect to the electrodes and anchoring molecules, such as the DNA described above, the DNA that is to extend between the electrodes may be subjected to conditions that tend to align them. The conditions could include subjecting the DNA molecules to an E-field or a flow field. If an E-field is utilized, it may be from about $10^4$ to about $10^6$ V/cm. On the other hand, if a flow field is utilized, V may be from about 1 to about 100 cm/sec.

Figure 11:
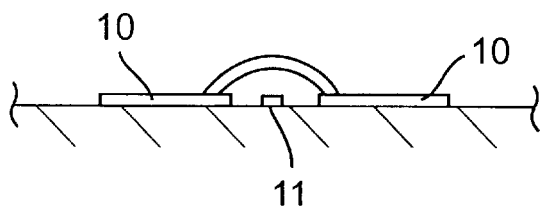

Encouraging the DNA to align in a particular manner helps to ensure that at least one of the DNA molecules will extend between the electrodes. Additionally, typically, no DNA bridges will extend outside of the region where the DNA bridge is shown in FIG. 11.

To facilitate formation of the DNA bridge(s), a fluorescent dye may be utilized to tag the DNA. The experiment is done under a microscope. As soon as one bridge is formed, the solution containing the DNA may be purged from the area of the electrodes.

Immobilization of the organic molecule, such as the DNA molecule illustrated in FIGS. 5 through 7 on the or above the conductors 11 may be accomplished by arranging an adhesion promoter between the DNA molecule and the conductors. The adhesion promoter may be any material that will encourage the DNA molecule to be immobilized on the conductors. According to one example, the adhesion promoter is a molecule that includes a sulfur atom at one end and a OH group at a second end. The sulphur atom may contact and bond to the conductors 11. On the other hand, the OH group may contact a portion of the DNA molecule. Including a sulphur molecule and adhesion promoter is especially useful where the conductors/electrodes 11 include gold or a gold-containing alloy.

After bonding of the DNA molecule(s) to the electrodes, at least one R-loop may be formed in each DNA molecule that forms a "bridge" between the electrodes. Typically, the R-loop is formed in a region of the DNA molecules between the electrodes 10 that is arranged over another electrode, such as the electrode(s) 11 described above. The formation of the R-loop is also described above. FIG. 5 illustrates a DNA molecule 13 extending between the electrodes 10, wherein the DNA molecule includes an R-loop 20 in the region of the DNA molecule over each electrode 11.

After formation of the R-loop(s), at least one nanoparticle may be bonded to the DNA molecule. At least one nanoparticle may be bonded to a portion of the DNA molecule that lies within each R-loop and that is not attached to the RNA molecule. To accomplish attachment of the nanoparticle to the DNA molecule, a suspension of the nanoparticle may be formed. The suspension may include nanoparticles with a modified surface, as described above. The nanoparticles may be suspended in water at a concentration of about 0.1% to about 10%.

After formation of the solution it may be dispensed in a region over the R-loop. The promoter 17 attached to the nanoparticle may then bond to the DNA within the R-loop. Typically, about 1 to about 10000 nucleotides attach to the nanoparticle to promote adhesion of the nanoparticle to the DNA molecule. The nucleotide(s) attached to the nanoparticle may be complementary to one or more nucleotides within the R-loop as described in greater detail above.

In the case of nucleotides on a nanoparticle bonding to a DNA molecule, the nucleotides on the nanoparticle may hydrogen bond to the nucleotides of the DNA molecule(s).

After attachment of the nanoparticle(s) to the DNA molecule extending between the electrodes 10, an electrically conducting material may be provided on the DNA molecule. The electrically conducting material may include any electrically conducting material. According to one example, silver may form a salt with the organic structure. Metallic silver may also be provided on the organic structure.

FIG. 7 illustrates an example of the present invention wherein electrically conducting material 18 is arranged on both sides of the DNA molecule with the exception of a portion of the DNA molecule including the R-loop where the DNA molecule is adhered to the conductor/electrode 11. The electrically conducting material on the DNA molecule can include silver ions bonded to phosphate groups of the DNA molecule. Alternatively and/or additionally, the electrically conducting material may include metallic silver bonded to the DNA molecule. When depositing silver on the DNA molecule that extends between the electrodes 10, no significant seeding and deposition of silver may take place on the R-loop, due to a lower density of silver ions.

The $Ag^+$ ions form a salt with a phosphate ion in the DNA backbone. In the double helix, the $O^-$ of the phosphate ions are evenly distributed around the double helix. However, the density is about 50% lower in the strand forming R-loop. Also, due to thermal vibration, as the Ag ion is reduced to Ag on the R-loop, it will migrate to the high density region, that is, the double helix region.

The electrically conducting material on the organic structure provides a conductor on the organic structure. In the case where the organic structure includes DNA, an R-loop in the DNA and a nanoparticle attached to the DNA molecule in the R-loop, the electrically conducting material on the organic structure may provide a conductor to the two sides of the R-loop on the DNA molecule.

The electrically conducting coating may be applied to the organic structure by immersing the organic structure in a solution that includes silver ions. The silver ions in the solution may then form a silver salt with the organic structure. In the case where the organic structure includes DNA, the silver may form a salt with phosphate groups of the DNA molecule. After formation of a salt, the silver in the salt may be reduced to metallic silver with a reducing agent. Examples of reducing agents that may be utilized include hydroquinone/$OH^-$ followed by hydroquinone/$OH^+$.

Deposition of the ferroelectric material in the embodiment illustrated in FIGS. 3d and 4 may be carried out by post-laser deposition (PLD). Post laser deposition is a method where a layer by layer deposition of various chemical moieties of each element may be performed. Stoichiometry of the post-laser deposition may be controlled by ablating a calibrated amount of material from the target of each element. Although the method illustrated in FIGS. 3a through 3d is one method to form a structure according to the present invention, alternative methods may utilize standard "lift-off" methods where photoresist acts as a mask to deposit metal lines directly. Lift-off may permit a higher resolution to be achieved. However, utilizing a lift-off method may be more complex than the standard photolithographic method illustrated in FIGS. 3a through 3d.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A memory device, comprising:
   at least one pair of conductors spaced apart a distance sufficient to permit a tunneling current therebetween;
   at least one nucleic acid molecule extending between said pair of conductors, said at least one nucleic acid comprising at least one DNA molecule and at least one RNA molecule bound to said DNA so as to form at least one R-loop; and
   at least one ferroelectric nanoparticle bound to said at least one R-loop between said pair of conductors.

2. The memory device according to claim 1, wherein each of the pair of conductors is a metal electrode including at least one metal selected from the group consisting of Al, Au, Ag, Cu, and alloys thereof.

3. The memory device according to claim 1, wherein the pair of conductors are separated in a horizontal direction by a distance of about 1 nm to about 100 nm.

4. The memory device according to claim 1, wherein the pair of conductors are separated in a horizontal direction by a distance of about 3 nm to about 30 nm.

5. The memory device according to claim 1, wherein the pair of conductors is arranged in the same plane.

6. The memory device according to claim 1, wherein the pair of conductors are separated in a vertical direction by a distance of up to about 10 nm.

7. The memory device according to claim 1, wherein the ferroelectric material includes at least one ferroelectric crystal between the pair of conductors.

8. The memory device according to claim 1, wherein the ferroelectric material includes at least one material selected from the group consisting of barium titanate, lead titanate, potassium niobiate, tri-glycine sulphate, Rochell salt, and lead iron niobiate.

9. The memory device according to claim 1, wherein the ferroelectric material has a Curie temperature of about 23° C. to about 490° C.

10. The memory device according to claim 1, wherein a voltage required to switch a dipole of the ferroelectric material is about 100 mV to about 10000 mV.

11. The memory device according to claim 1, wherein a voltage required to read the memory device by measuring tunneling current resulting from application of the read voltage across the pair of conductors is less than the voltage required to switch a dipole of the ferroelectric material.

12. The memory device according to claim 11, wherein the tunneling current is high when the read voltage is antiparallel to a remnant polarization induced in the ferroelectric material by applying a bias voltage between the pair of conductors.

13. The memory device according to claim 11, wherein the tunneling current is low when the read voltage is parallel to a remnant polarization induced in the ferroelectric material by applying a bias voltage between the pair of conductors.

14. The memory device according to claim 1, wherein a voltage required to read the memory device by measuring tunneling current resulting from application of the read voltage across the pair of conductors is less than about one-half of the voltage required to switch a dipole of the ferroelectric material.

15. The memory device according to claim 1, wherein a voltage required to read the memory device by measuring tunneling current resulting from application of the read voltage across the pair of conductors is less than about 10 mV.

16. The memory device according to claim 1, further comprising:
dielectric material having a dielectric constant of about 1 to about 10 surrounding the pair of conductors and the ferroelectric material.

17. The memory device according to claim 16, wherein the dielectric material includes at least one material selected from the group consisting of air, $Si_3N_4$, alumina and $SiO_2$.

18. The memory device according to claim 1, wherein the ferroelectric material has a thickness of less than about 10 nm.

19. The memory device according to claim 1, wherein a remnant polarization can be induced in the ferroelectric material by applying a bias voltage between the pair of conductors, the bias voltage being sufficient to produce an electric field higher than a coercive field of the ferroelectric material.

20. The memory device according to claim 19, wherein the remnant polarization may be reversed by changing the sign of the bias voltage between the conductors.

21. The memory device according to claim 19, wherein the voltage reversing the remnant polarization represents a write bias voltage.

22. The memory device according to claim 19, wherein a remnant polarization can also be induced by local heating applied during application of the bias voltage.

23. The memory device according to claim 1, wherein the organic molecule includes at least one DNA molecule.

24. The memory device according to claim 23, wherein the organic molecule further includes at least one oligomer attached to at least one location on the at least one DNA molecule.

25. The memory device according to claim 23, further comprising:
an electrically conducting material on the DNA molecule.

26. The memory device according to claim 23, wherein the organic molecule further includes a monolayer of oligomers attached to at least a portion of the at least one DNA molecule.

27. The memory device according to claim 1, wherein the at least one DNA molecule is double stranded and includes at least one R-loop, the memory device further comprising:
at least one chemical moiety attached to at least one nucleotide in the at least one R-loop, wherein the at least one chemical moiety includes the ferroelectric material.

28. The memory device according to claim 27, wherein the at least one chemical moiety is attached to at least one selected nucleotide in the at least one R-loop.

29. The memory device according to claim 28, wherein the at least one chemical moiety is attached to the at least one nucleotide in the at least one R-loop by at least one covalent bond.

30. The memory device according to claim 27, wherein the at least one chemical moiety is attached to the at least one nucleotide in the at least one R-loop by at least one hydrogen bond.

31. The memory device according to claim 27, wherein the at least one chemical moiety is attached to the at least one nucleotide in the at least one R-loop with at least one hydrogen bond or at least one covalent bond.

32. The memory device according to claim 27, wherein the at least one chemical moiety includes at least one nucleotide.

33. The memory device according to claim 32, wherein the at least one chemical moiety includes two nucleotides.

34. The memory device according to claim 32, wherein the at least one chemical moiety includes guanine and cytosine or thymine and adenine.

35. The memory device according to claim 27, wherein the at least one chemical moiety includes at least two different moieties.

36. The memory device according to claim 35, wherein at least one of the moieties is capable of bonding to the at least one nucleotide in the at least one R-loop.

37. The memory device according to claim 27, wherein the at least one chemical moiety includes at least one acid and at least one alcohol.

38. The memory device according to claim 27, wherein the at least one chemical moiety is attached to at least one amide group on the at least one DNA molecule within the R-loop.

39. The memory device according to claim 27, wherein the at least one chemical moiety includes at least one nanoparticle attached to at least one nucleotide within the R-loop, the nanoparticle providing the ferroelectric material.

40. The memory device according to claim 39, wherein the at least one nanoparticle has a maximum width of less than about 10 nm.

41. The memory device according to claim 27, wherein the DNA is λ-DNA.

42. The memory device according to claim 27, wherein RNA forming the R-loop has a length of about 10 to about 1500 bases.

43. The memory device according to claim 27, wherein RNA forming the R-loop has a length of about 30 to about 300 bases.

44. The memory device according to claim 27, wherein RNA forming the R-loop has a length of about 3 nm to about 500 nm.

45. The memory device according to claim 27, wherein RNA forming the R-loop has a length of about 10 nm to about 100 nm.

46. The memory device according to claim 27, further comprising:
an electrically conducting material on the DNA molecule.

47. The memory device according to claim 46, wherein the electrically conducting material includes silver ions bonded to phosphate groups of the DNA molecule.

48. The memory device according to claim 46, wherein the electrically conducting material includes metallic silver on the DNA molecule.

49. The memory device according to claim 1, further comprising:
an electrically conducting material on the organic molecule extending between the first electrode and the second electrode.

50. The memory device according to claim 1, further comprising:
a plurality of first parallel conductors extending on a substrate in a first direction.

51. The memory device according to claim 50, wherein the first parallel conductors are equidistant from each other.

52. The memory device according to claim 50, further comprising:
a double stranded DNA molecule extending across a plurality of the first conductors, the DNA molecule including an R-loop above a plurality of the first conductors; and
at least one chemical moiety attached to at least one nucleotide in a plurality of the R-loops.

53. The memory device according to claim 52, wherein the chemical moieties are attached to at least one selected nucleotide in the R-loops.

54. The memory device according to claim 52, wherein the chemical moieties are attached to the at least one nucleotide in the R-loops by at least one bond selected from the group consisting of hydrogen bonds and covalent bonds.

55. The memory device according to claim 52, wherein the chemical moieties include at least one nucleotide.

56. The memory device according to claim 52, wherein the chemical moieties include at least two different moieties.

57. The memory device according to claim 56, wherein at least one of the moieties is capable of bonding to the at least one nucleotide in the R-loops.

58. The memory device according to claim 56, wherein the chemical moieties include at least one acid and at least one alcohol.

59. The memory device according to claim 52, wherein the chemical moieties are attached to at least one amide group on the at least one DNA molecule within the R-loops.

60. The memory device according to claim 52, wherein the chemical moieties each include two nucleotides.

61. The memory device according to claim 52, wherein the chemical moieties each include guanine and cytosine or thymine and adenine.

62. The memory device according to claim 52, wherein the chemical moieties include at least one nanoparticle attached to at least one nucleotide within the R-loops, the nanoparticle providing the ferroelectric material.

63. The memory device according to claim 62, wherein the at least one nanoparticle has a maximum width of less than about 10 nm.

64. The memory device according to claim 52, wherein the DNA is λ-DNA.

65. The memory device according to claim 52, wherein RNA forming the R-loop has a length of about 10 to about 1500 bases.

66. The memory device according to claim 52, wherein RNA forming the R-loop has a length of about 30 to about 300 bases.

67. The memory device according to claim 52, wherein RNA forming the R-loop has a length of about 3 nm to about 500 nm.

68. The memory device according to claim 52, wherein RNA forming the R-loop has a length of about 10 nm to about 100 nm.

69. The memory device according to claim 52, wherein the DNA molecule includes ends anchored to two of the conductors, the memory device further comprising:
an organic molecule bonded to a surface of the conductors that the DNA molecule is anchored to.

70. The memory device according to claim 69, wherein the DNA molecule includes sticky ends anchored to the anchoring conductors.

71. The memory device according to claim 70, wherein the organic molecule bonded to the surface of the conductors that the DNA molecule is anchored to is DNA.

72. The memory device according to claim 71, wherein the DNA molecule bonded to the surface of the conductors that the DNA molecule is anchored to is sulfur terminated and single stranded.

73. The memory device according to claim 71, wherein the DNA molecule bonded to a first of the anchoring conductors has a different sequence than the DNA molecule bonded to a second of the conductors.

74. The memory device according to claim 71, wherein the DNA molecules bonded to the anchoring conductors include from about five to about twenty base pairs.

75. The memory device according to claim 71, wherein the DNA molecule extending between the anchoring conductors includes sticky ends that hybridize with the DNA molecules bonded to the surface of the anchoring conductors.

76. The memory device according to claim 69, wherein the anchoring conductors are made of gold or a gold-containing alloy.

77. The memory device according to claim 52, further comprising:
an adhesion promoter arranged between the R-loops and the conductors.

78. The memory device according to claim 77, wherein the adhesion promoter is a molecule that includes a sulfur atom for contacting the conductors at a first end and an OH group for contacting the DNA molecule at a second end.

79. The memory device according to claim 77, further comprising:
at least one chemical moiety attached to the nanoparticle for bonding the nanoparticle to the DNA molecule, wherein the adhesion promoter and at least one chemical moiety for attaching the nanoparticle to the DNA form a tunneling gap.

80. The memory device according to claim 52, further comprising:
an electrically conducting material on the DNA molecule.

81. The memory device according to claim 80, wherein the electrically conducting material includes silver ions bonded to phosphate groups of the DNA molecule.

82. The memory device according to claim 80, wherein the electrically conducting material includes metallic silver on the DNA molecule.

83. The memory device according to claim 52, wherein the first parallel conductors are equidistant from each other.

84. The memory device according to claim 52, wherein the DNA molecule is perpendicular to the first parallel conductors.

85. The memory device according to claim 50, further comprising:
   a plurality of second parallel conductors overlapping the first parallel conductors extending on the substrate and the first parallel conductors in a second direction perpendicular to the first parallel conductors, wherein the ferroelectric material is arranged between the first parallel conductors and the second parallel conductors.

86. The memory device according to claim 85, further comprising:
   an adhesion layer between the substrate and the first parallel conductors and the second parallel conductors where the first parallel conductors and the second parallel conductors overlap the substrate.

87. The memory device according to claim 86, wherein the adhesion layer includes at least one metal selected from the group consisting of Cr and Ti.

88. The memory device according to claim 85, wherein the substrate is glass or ceramic.

89. The memory device according to claim 85, wherein the first parallel conductors and the second parallel conductors have a width of about 50 nm to about 5000 nm.

90. The memory device according to claim 85, wherein the first parallel conductors are separated from each other by a distance of about 50 nm to about 5000 nm and the second parallel conductors are separated from each other by a distance of about 50 nm to about 5000 nm.

91. The memory device according to claim 85, wherein the second parallel conductors are equidistant from each other.

* * * * *